Figure 1A:
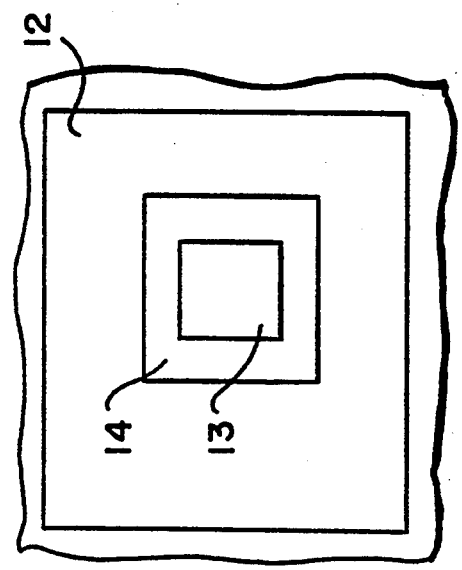

United States Patent [19]

Meister et al.

[11] Patent Number: 5,402,002
[45] Date of Patent: Mar. 28, 1995

[54] BIPOLAR TRANSISTOR WITH REDUCED BASE/COLLECTOR CAPACITANCE

[75] Inventors: Thomas Meister, Taufkirchen; Hans-Willi Meul, Bruckmühl, both of Germany

[73] Assignee: Siemens Aktiengesellschaft, Munich, Germany

[21] Appl. No.: 737,607

[22] Filed: Jul. 24, 1991

Related U.S. Application Data

[63] Continuation of Ser. No. 587,056, Sep. 24, 1990, abandoned.

[30] Foreign Application Priority Data

Sep. 22, 1989 [EP] European Pat. Off. .......... 89117579

[51] Int. Cl.⁶ ............................................. H01L 29/72
[52] U.S. Cl. ............................... 257/586; 257/592
[58] Field of Search .......................... 257/586, 592

[56] References Cited

U.S. PATENT DOCUMENTS

| | | | |
|---|---|---|---|
| 4,696,097 | 9/1987 | McLaughlin et al. | 357/59 H |
| 4,889,823 | 1/1989 | Bertagnolli et al. | 357/34 X |
| 4,897,704 | 1/1990 | Sakurai | 357/34 X |

Primary Examiner—Rolf Hille
Assistant Examiner—Roy Potter
Attorney, Agent, or Firm—Herbert L. Lerner; Laurence A. Greenberg

[57] ABSTRACT

A bipolar transistor includes insulator structures defining an active transistor zone having a base, an emitter with a side facing away from the base, and a collector with a collector terminal having a side facing away from the base. The insulator structures are disposed on the sides of the emitter and the collector terminal facing away from the base, and the insulator structures limit current flow through the active transistor zone. A process for producing the bipolar transistor includes producing a collector by selective epitaxy on a zone of a substrate surrounded by insulators. A zone for the collector is defined with a spacer technique in the following steps: photolithographically producing a first opening in a first layer exposing a surface of a second layer; including at least one insulation layer in the second layer; producing spacers at edges of the first opening; and etching a second opening in the second layer defining the zone for the collector during selective back-etching of the spacers.

6 Claims, 7 Drawing Sheets

FIG 2
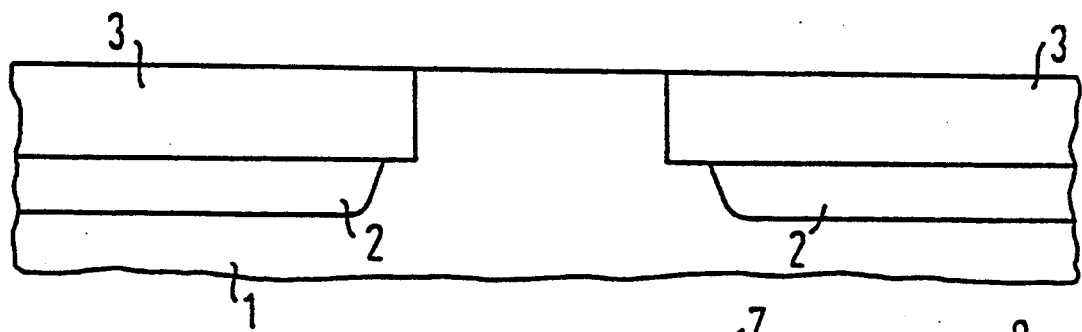
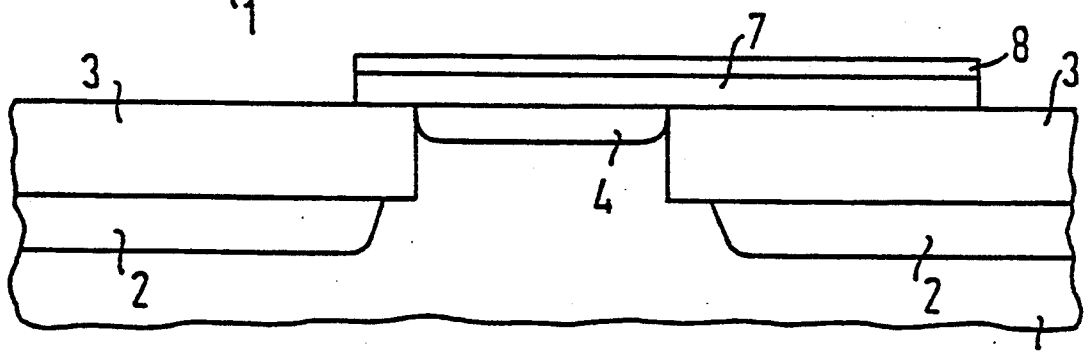
FIG 3

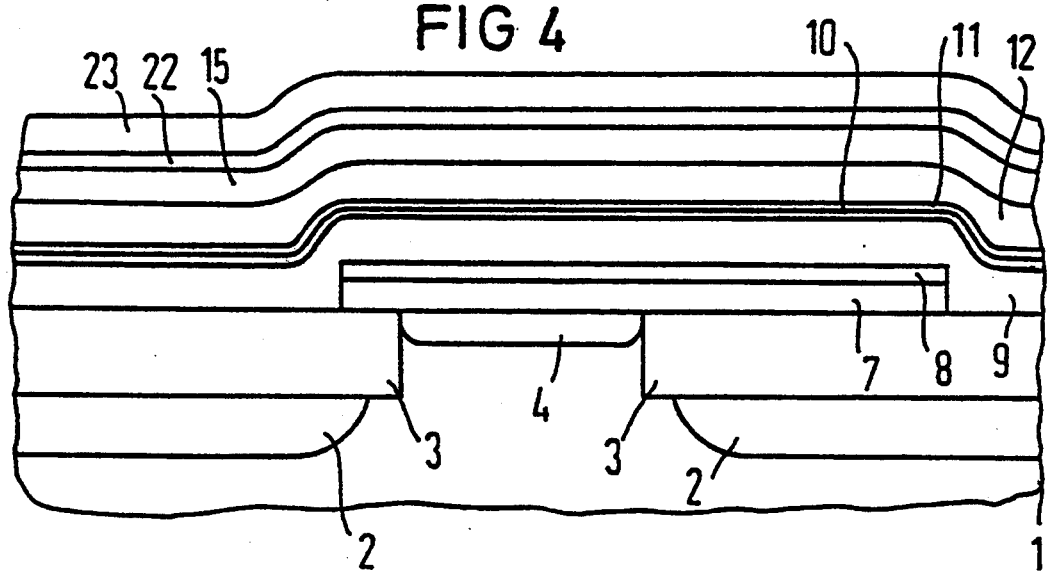
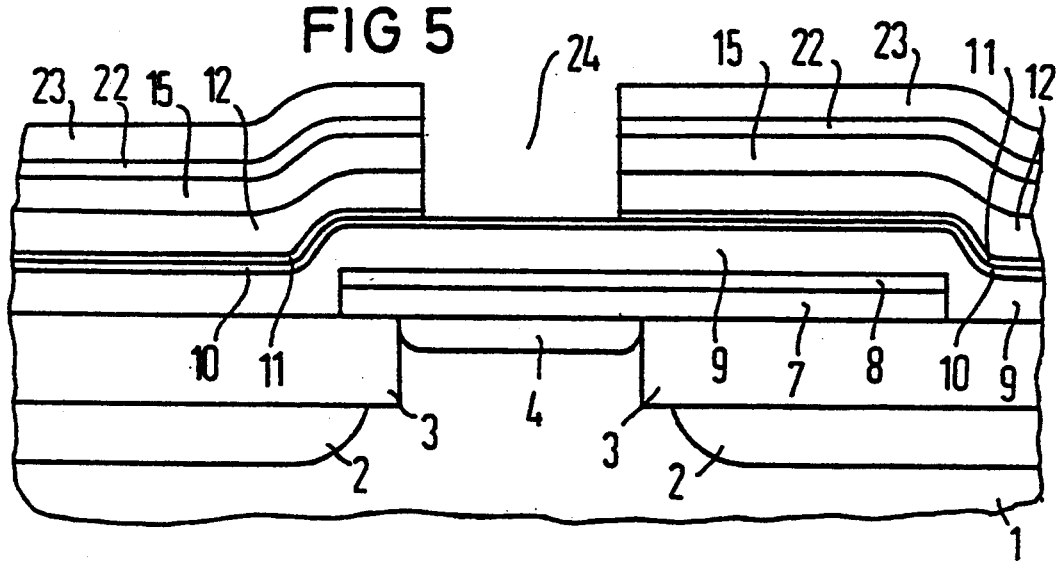
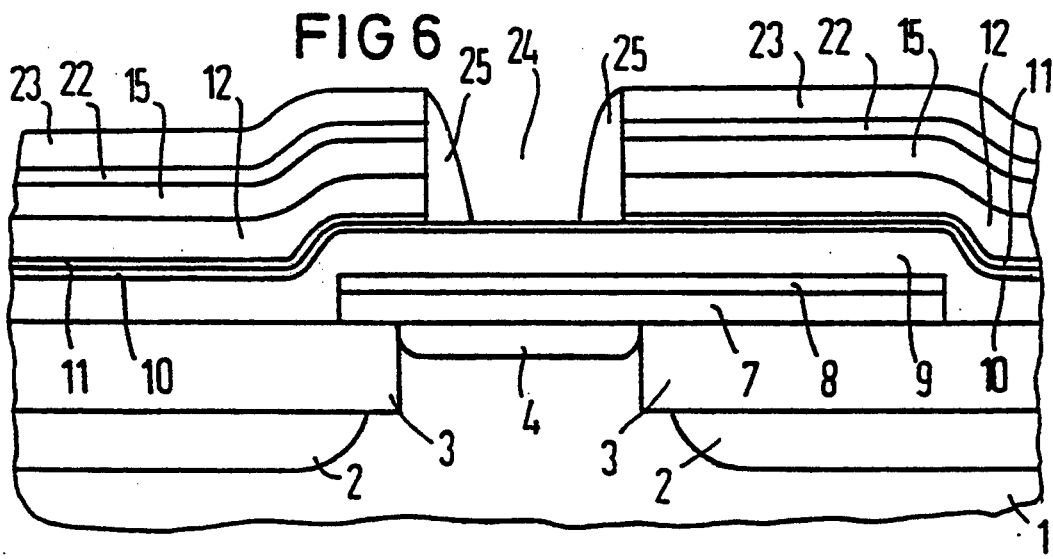

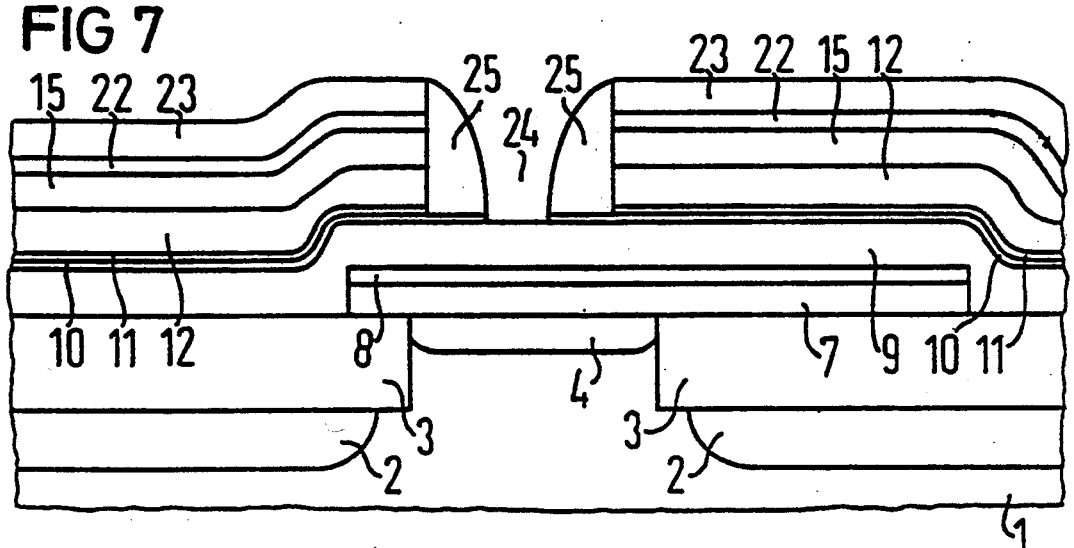
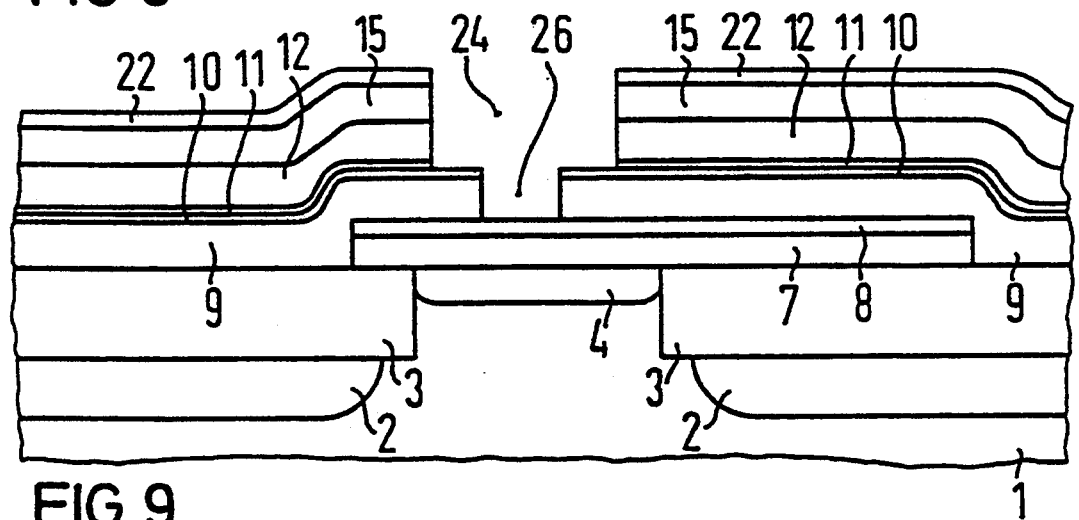
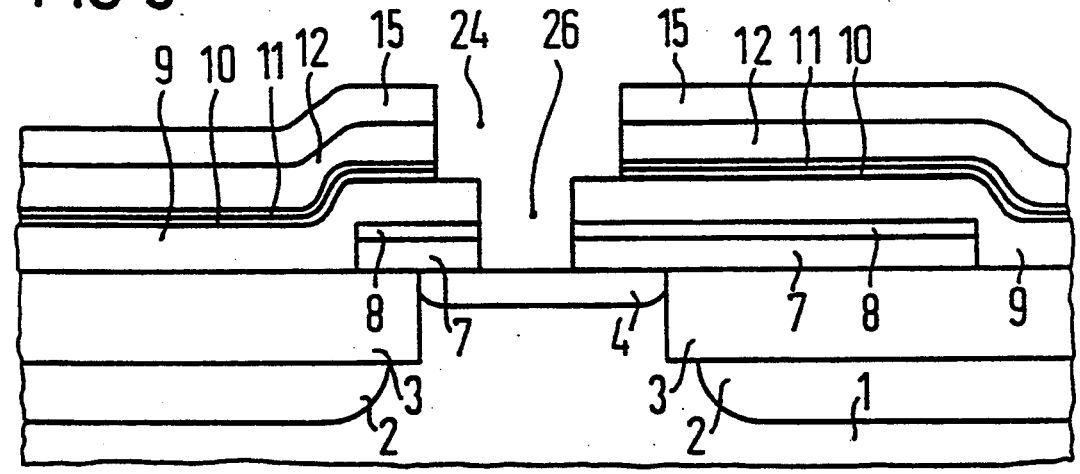

BIPOLAR TRANSISTOR WITH REDUCED BASE/COLLECTOR CAPACITANCE

This application is a continuation of Ser. No. 07/587,056, filed Sep. 24, 1990, now abandoned.

The invention relates to a bipolar transistor and a process for producing the same.

With increasing miniaturization of bipolar transistors through the use of photo techniques of ever higher resolution, the "power delay" product and switching speed at low currents is still determined by the external base/collector capacitance and the parasitic collector/substrate capacitance. During lateral scaling of the transistor size, an attempt must therefore be made to keep the amounts of the inactive transistor zones minimal in relation to the total capacitance. Processes that are intended to reduce the capacitance of the inactive transistor zones by self-adjusting techniques are well known in the literature.

For instance, in IEDM Technical Digest (1980), page 58, D. D. Tang et al have proposed a self-adjusting bipolar transistor in which the base terminal as well as both the collector and the emitter are made self-aligned. In this process the collector is deposited by selective epitaxy between insulation structures. The active base implanted therein is contacted laterally by a base terminal zone of polysilicon.

As a result, the base terminal has little contact with the active collector zone.

The so-called SICOS Process (sidewall base contact is silicon) which is known, for instance, from T. Nakamura et al in IEEE Trans. Electron. Dev., Vol. 29 (1982), page 596, is based on an island or mesa etching structure. In that case, a base terminal zone of polysilicon rests with coincident edges on a silicon oxide layer. The active base is contacted from the side wall.

However, such known transistors have disadvantages that have ever increasing effects with increasing scaling of the emitter width (in other words with decreasing emitter width).

As a result of the inherent temperature strains in the process, dopant diffuse laterally out of the polysilicon base terminal into the active base. The out-diffusion is necessary to a certain extent, in order to obtain a low base terminal resistance (see Goto, Journal de Physique, Colloquium C4, Supplement to n=9, Vol. 49, 1988, C4-471). In the case of a selective epitaxial layer, such as that used in the transistor known from D. D. Tang et al in IEDM Technical Digest (1980), page 58, grain boundaries that impair the transistor function or make it entirely impossible are created at the lateral base edge when the collector window is selectively filled. The function of the transistor structure proposed by Tang et al may possibly be improved if a considerable out-diffusion of dopants from the base terminal takes place, thus shifting the grain boundaries as such as possible into inactive transistor zones. The resultant parasitic contribution to the base/collector capacitance has an ever increasing effect with decreasing emitter width, since the spatial weight of the region in which the base terminal comes into contact with the active collector zone does not vary with decreasing emitter width.

Furthermore, the lateral out-diffusion of the dopant atoms from the polysilicon base terminal reduces the active transistor surface area, so that at the edges of the emitter/base junction, additional new parasitic transistor zones are created, which proportionately increase the emitter/base capacitance.

It is accordingly an object of the invention to provide a bipolar transistor with reduced base/collector capacitance and a process for producing the same, which overcome the hereinafore-mentioned disadvantages of the heretofore-known methods and devices of this general type and in which the proportion of the total electrically operative base terminal region relative to the base/collector capacitance is miniaturized, without thereby generating other parasitic capacitances in the transistor.

With the foregoing and other objects in view there is provided, in accordance with the invention, a bipolar transistor, comprising insulator structures defining an active transistor zone having a base, an emitter with a side facing away from the base, and a collector with a collector terminal having a side facing away from the base, the insulator structures being disposed on the sides of the emitter and the collector terminal facing away from the base, and the insulator structures limiting current flow through the active transistor zone.

In accordance with another feature of the invention, the emitter and the collector have surfaces, and the insulator structures define active surfaces on the emitter surface or terminal and the collector surface or terminal preferably being of equal size and facing one another. The bipolar transistor according to the invention consequently has a unidimensional transistor structure. In unidimensional transistor structures, the parasitic capacitance proportions are minimized.

In accordance with again another feature of the invention, the emitter and the collector have surfaces, and the insulator structures define active surfaces on the emitter surface and the collector surface being or equal size and facing one another.

In accordance with a further feature of the invention, the base has a base terminal laterally contacting and annularly surrounding the base and inactive base zones formed by out-diffusion from the base terminal; the base terminal and the inactive base zones being disposed between the insulator structures defining the active transistor zone, for completely avoiding a boundary surface between the base terminal and the collector and minimizing contact between the inactive base zone and the collector.

As a result of the base being provided with a lateral base terminal, the base is laterally contacted. As a result of the base terminal being disposed entirely between the insulator structures defining the active transistor zone, the boundary surface between the base terminal and the collector is minimized. The boundary surface engenders the interfering parasitic base/collector capacitances. Since the base terminal is completely buried in insulator structures, parasitic capacitances that could, for instance, be ascribed to a boundary surface between the base terminal and the active emitter, for instance, are also minimized.

In accordance with an added feature of the invention, there is provided an $n^+$-doped subcollector, which is disposed under the collector, and is contacted by a buried, electrically conductive layer (for instance, $n^+$ polysilicon, silicide, polycide, tungsten, etc.), which for the most part extends across insulation material and thus is completely dielectrically insulated from the silicon material having the opposite conductivity type. This buried collector terminal is laterally extended farther across the subcollector.

Laterally of the active transistor zone, a contact hole filled with a metallization meets the buried, conductive layer. Since the collector is electrically bonded in this way, an extended subcollector that is required in the prior art, usually along with a second silicon island, for connection of the collector, can be dispensed with. The connection of the collector through the conductive layer buried in oxide zones according to the invention, brings about a considerable reduction in the parasitic collector/substrate capacitance and enables a very compact structure or the transistor and thus an increase in the scale of integration in integrated circuits. The transistor is suitable for integrated so-called SICMOS circuits, which include both bipolar and CMOS transistors.

The entire collector terminal is completely dielectrically insulated from the silicon substrate of the opposite conductivity type. Since the contact surface between the subcollector and the silicon substrate is also kept minimal, a transistor structure having a likewise negligible collector/substrate capacitance is the result.

In accordance with yet a further feature of the invention, the insulator structures have a side adjacent the active transistor with a structure being disposed beneath the base terminal and protruding past the base terminal by a zone being self-aligned by a spacer technique; and the inactive base zones are disposed on the zone being self-aligned by a spacer technique.

In accordance with an additional feature of the invention, the collector terminal laterally overlapping the subcollector is, for instance, a double layer including one doped polysilicon layer and one layer containing metal. The metal-containing layer includes a metal silicide, for instance. The buried collector terminal is disposed annularly around the collector. It is disposed above the subcollector. The subcollector and the collector terminal are in contact with one another. The polysilicon layer and the subcollector are of the same conductivity type as the collector, but have a higher conductivity than the collector. This version of the collector terminal makes a very low-impedance collector terminal possible. Nevertheless, the collector/substrate capacitance is kept quite low because, as mentioned above, a second silicon island for connection of the collector is dispensed with, and the collector terminal is completely dielectrically insulated from the silicon material of the opposite conductivity type.

This version of the invention is particularly well suited to integration in BICMOS circuits. When a BICMOS circuit of this kind is produced, the buried collector terminal and the gate miniaturizations can be of the same material and can be produced simultaneously. Through the use of the buried collector terminal, a further insulator is provided, which can be used in a BICMOS circuit to protect the CMOS transistors from the process steps necessary for producing the bipolar transistors. Since the collector of the transistor according to the invention is produced by selective epitaxy, it can be integrated at little expense into a BICMOS process and the bipolar components can be optimized independently of the CMOS components.

In accordance with yet another feature of the invention, the collector terminal includes at least one layer being formed of a material selected from the group consisting of doped polysilicon and silicide.

With the objects of the invention in view there is also provided a process for producing a bipolar transistor, which comprises producing a collector by selective epitaxy on a zone of a substrate surrounded by insulators; and defining a zone for the collector with a spacer technique in the following steps: photolithographically producing a first opening in a first layer exposing a surface of a second layer; including at least one insulation layer in the second layer; producing spacers at edges of the first opening; and etching a second opening in the second layer defining the zone for the collector during selective back-etching of the spacers.

Through the use of the spacer technique for defining the collector zone, collector widths become possible that are less than the minimum spacings attainable with photolithography resolution, by twice the spacer width.

During selective back-etching of the spacers, a step is created. In one possible embodiment, the upper portion of the step includes a polysilicon layer that laterally contacts the selectively deposited base. Instead of the polysilicon layer, a silicide layer may, for instance, be used. The polysilicon layer is disposed as produced, and in a self-aligned manner, in such a way that there is no boundary surface between the collector and the polysilicon layer. The base is grown on the collector by selective epitaxy, creating inactive base zones in the vicinity of the step.

Once the base terminal is covered by a further spacer technique, the emitter is produced by out-diffusion from a suitable doped further polysilicon layer.

The production process described for a bipolar transistor according to the invention is carried out in a self-aligned manner. Only the location and size of the first opening are defined by photolithography. The other location definitions are provided in a self-aligned manner with the aid of spacer techniques. The spacer technique exploits the fact that the width of a spacer is determined solely by the thickness of the deposited layer. The spacer width is independent of alignement tolerances and resolution problems of the kind that arise in photolithography.

In accordance with another mode of the invention, there is provided a process which comprises producing a base and inactive base zones on the collector in the first opening by selective epitaxy; and including at least one low-impedance conductive layer in the first layer forming a lateral base terminal for the base.

In accordance with a concomitant mode of the invention, there is provided a process which comprises generating and anisotropically back-etching an insulation layer on the first layer producing inner spacers on the edges of the first opening, after production of the base and the inactive base zones; and generating a suitably doped polysilicon layer, and subsequently producing an emitter by out-diffusion from the suitably doped polysilicon layer.

Other features which are considered as characteristic for the invention are set forth in the appended claims.

Although the invention is illustrated and described herein as embodied in a bipolar transistor with reduced base/collector capacitance and a process for producing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
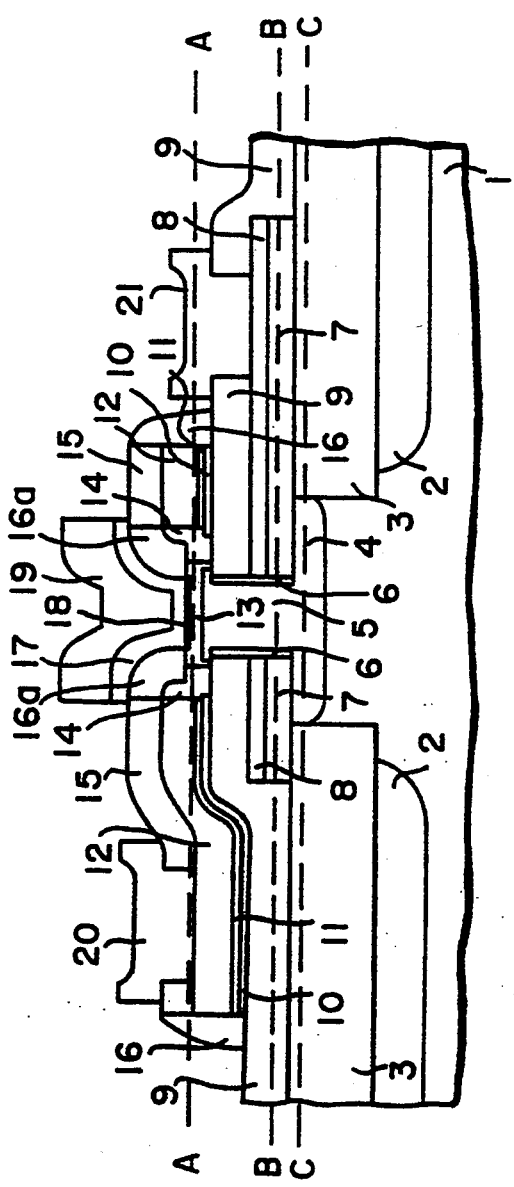

FIG. 1 is a fragmentary, diagrammatic, cross-sectional view of a bipolar transistor according to the invention; and FIGS. 2–16 are fragmentary, cross-sectional view showing production steps for a bipolar transistor according to the invention.

Referring now to the figures of the drawings in detail and first, particularly, to FIG. 1 thereof, there is seen a substrate 1 which includes weakly p-doped (100) Czochralski silicon, for example. Channel stopper zones 2 are disposed in the substrate 1. Box insulators 3, such as those known from the article by K. Kurosowa et al, in IEDM Tech. Dig. (1981), page 384, are disposed above the channel stopper zones 2. Naturally, one possible alternative is to use a conventional LOCOS insulator. An $n^+$-doped subcollector 4 is disposed between the box insulators 3. The subcollector 4 is flatter than the box insulators 3 which serve to insulate adjoining circuit elements in the substrate 1.

A collector 5 is disposed on the subcollector 4. The collector 5 is $n^-$-doped, for example. The collector 5 is surrounded by lateral surface or flank insulators 6. The lateral surface insulators may, for instance, include a thin film of silicon nitride or silicon oxide.

In order to produce a collector terminal, a first polysilicon layer 7 is provided. The first polysilicon layer 7 is $n^+$-doped, for instance. The first polysilicon layer 7 annularly surrounds the collector 5 around the lateral surface insulators 6. The first polysilicon layer 7 is disposed on the surface of the subcollector 4 and the box insulators 3. On one side of the collector 5, the first polysilicon layer 7 extends at least far enough to reach the adjacent box insulator 3, so that contacting through a contact hole is possible at that location.

A conductive layer 8 is disposed on the first polysilicon layer 7. The conductive layer 8 may, for instance, include a metal silicide and has a thickness of 80 nm. The conductive layer 8 and the first polysilicon layer 7 form vertical lateral surfaces. The conductive layer 8 improves the conductivity of the first polysilicon layer 7. The first polysilicon layer 7 and the conductive layer 8 together form the collector terminal.

The surfaces of the box insulators 3, the first polysilicon layer 7 and the conductive layer 8 are covered with a first oxide film 9. The first oxide film 9 is flush in height with the lateral surface insulators 6. The first oxide film 9 and the lateral surface insulators 6 laterally define the active portion of the collector 5.

A first auxiliary polysilicon layer 10 and a first auxiliary oxide film 11 are disposed on the first oxide film 9. The first auxiliary polysilicon layer 10 and the first auxiliary oxide film 11 are required in the production process and have no further function for the transistor.

A second polysilicon layer 12 is disposed on the first auxiliary oxide film 11. The second polysilicon layer 12 is $p^+$-doped, for instance and forms a base terminal. The second polysilicon layer 12 is disposed annularly about the active transistor zone.

A base 13 is disposed above the collector 5. The base 13 is p-doped, for instance and is formed of monocrystalline silicon. The base 13 is surrounded by a monocrystalline inactive base zone 14. The inactive base zone 14 is $p^+$-doped and furnishes the connection between the second polysilicon layer 12 and the base 13.

The second polysilicon layer 12 and part of the surface of the inactive base zone 14 are covered by a second oxide film 15. The lateral surfaces of the second polysilicon layer 12 and inactive base zone 14 are covered by spacers 16. The layers 10, 11, 12 and 15 together can also be considered a first layer and the layer 9 can be considered a second layer.

A third polysilicon layer 17 is disposed on the second oxide film 15 and the spacers 16, which are disposed above the inactive base zone 14. The third polysilicon layer 17 is $n^+$-doped for instance and an emitter contact 19 is disposed on the third polysilicon layer. A contact hole, which is filled with a base contact 20, is provided in the second oxide film 15. A contact hole is opened in the first oxide film 9 and filled with a collector contact 21. The collector contact 21 leads to the conductive layer 8. The base contact 20 leads to the second polysilicon layer 12.

The second polysilicon layer 12, which forms the base terminal, and the monocrystalline inactive base zone 14, which is likewise a component of the base terminal, are completely surrounded by insulator structures as follows: from the top they are surrounded by the spacers 16 and the second oxide film 15, and from below they are surrounded by the first oxide film 9. The active zone of the collector 5 is located inside the lateral surface insulators 6. Except for a location above the lateral surface insulator 6 in which a small region of the collector 5 extends into the base 13 as a consequence of epitaxial overgrowth, there are no points of contact between the base terminal and the active collector. The third polysilicon layer 17, from which an emitter 18 is produced by out-diffusion, is applied to the second oxide film 15 and spacers 16.

A self-aligned production process for the transistor according to the invention will be described below. Identical features are referred to by the same reference numerals. The basis for the exemplary embodiment of the production process is a 0.4 $\mu$m photolithography with an adjustment tolerance of approximately 0.133 $\mu$m.

FIG. 2 shows the substrate 1. In the substrate 1, which is weakly p-doped and is formed of monocrystalline silicon, the channel stopper zones 2 and box insulators 3 are produced, such as by the production process known from K. Kurosowa et al, in IEDM Tech. Dig. 1981, p. 384. The spacing of the edges of the box insulators 3 is 0.9 $\mu$m.

An undoped first polysilicon layer 7 having a thickness of 80 nm, for instance, is deposited over the entire surface, as seen in FIG. 3. The first polysilicon layer 7 is implanted with n-doped ions. The conductive layer 8 is applied over the first polysilicon layer 7. The conductive layer 8 includes a silicide, for instance, and has a thickness of 80 nm, for instance. Through the use of out-diffusion from the first polysilicon layer 7 into the substrate between the box insulators 3, the subcollector 4 is produced. The conductive layer 8 and the first polysilicon layer 7 are structured in such a way that they reliably overlap the edges of the box insulators 3. At least on one side, the overlapping must be great enough to enable contact hole etching laterally of the subcollector 4 onto the conductive layer 8.

The first oxide film 9 is applied over the entire surface of the resultant structure, as seen in FIG. 4. The first oxide film 9 is deposited to a thickness of 200 nm, for example. The first auxiliary polysilicon layer 10 is applied onto the first oxide film 9. The first auxiliary polysilicon layer 10 is applied to a thickness of 30 nm, for example. It may be doped or undoped. The first auxiliary oxide film 11 is applied at a thickness of 20 nm, for instance, to the first auxiliary polysilicon layer 10.

The second polysilicon layer 12 is applied on the first auxiliary oxide film 11. The second polysilicon layer 12 has a thickness of 150 nm, for instance. The second polysilicon layer 12 is implanted with p-doped atoms. The second oxide film 15 is applied over the entire surface of the second polysilicon layer 12 at a thickness of 150 nm, for instance. A second auxiliary polysilicon layer 22 is applied on the second oxide film 15 at a thickness of 30 nm, for instance. A second auxiliary oxide film 23 is applied on the second auxiliary polysilicon layer 22 to a thickness of 80 nm, for instance.

Through the use of a photo technique, the second auxiliary oxide film 23, the second auxiliary polysilicon layer 22, the second oxide film 15, the second polysilicon layer 12, and the first auxiliary oxide film 11 are structured by dry etching steps, so that a first opening 24 is created. The first opening 24 is disposed completely above the subcollector 4, as seen in FIG. 5.

An oxide film which is 150 nm thick is deposited over the entire surface area of the second auxiliary oxide film 23. This film is anisotropically back-etched, creating first oxide spacers 25 on the side walls of the first opening 24, as seen in FIG. 6. The first oxide spacers 24 function to self-align the surface on which the base 13 is later produced and the surface on which the collector is later produced and to align them identically to one another.

In a further dry etching step, the first auxiliary polysilicon layer 10 is eliminated at the bottom of the first opening 24, as seen in FIG. 7.

A second opening 26 is etched into the first oxide film 9 with the aid of a selective etching step. Although the selective etching eliminate the silicon oxide, it either does not attack polysilicon and metal silicide substances, or it attacks them hardly at all. An example of an etching agent is $CHF_3+O_2$. The second opening 26 extends as far as the conductive layer 8, which is not attacked because of the selectively of the etching, as seen in FIG. 8. In this selective etching step, the second auxiliary oxide film 23 the first oxide spacers 25 and the portion of the first auxiliary oxide film 11 located under the first oxide spacers 25 are simultaneously eliminated. In this process, the second auxiliary polysilicon layer 22 acts as an etching stopper under the second auxiliary oxide film 23. The first auxiliary polysilicon layer 10 acts as an etching stopper under the first auxiliary oxide film 11.

The location and dimensions of the second opening 26 are determined by the shape of the first oxide spacers 25. The width of the first oxide spacers 25 is adjustable by means of the thickness of the oxide film from which the first oxide spacers 25 are created by anisotropic back-etching. The location and dimensions of the second opening 26 are therefore fixed in a self-aligned manner or in other words without using a photo technique. The width of the second opening can be below the resolution capacity of lithography.

With a dry etching step, first the conductive layer 8 and then the first polysilicon layer 7 beneath it are eliminated at the bottom of the second opening 26. This lays bare or exposes the surface of the subcollector 4 in the region of the second opening 26, as seen in FIG. 9. In this dry etching step, the second auxiliary polysilicon layer 22 and the exposing portions of the first auxiliary polysilicon layer 10 are eliminated simultaneously.

Figure 10:
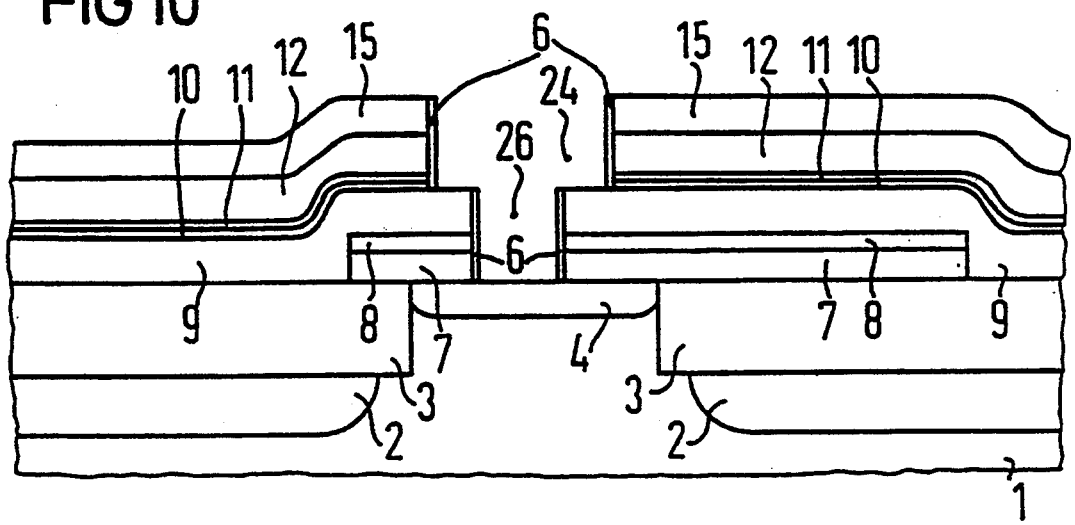
Figure 11:
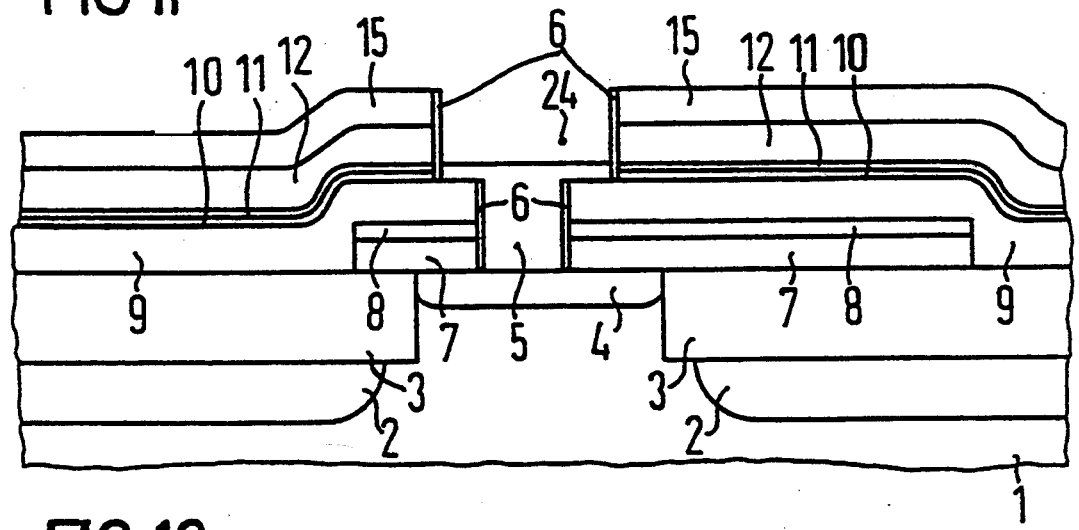

Next, lateral surface insulators 6 are produced on the walls of the first opening 24 and the second opening 26, as seen in FIG. 10. To this end, a thin insulation film of silicon oxide or silicon nitride, for instance, is produced over the entire surface area, and it is eliminated again by anisotropic etching on the second oxide film 15, on the first oxide film 9, and on the surface of the buried zone 4.

The second opening 26 is filled selectively with n-conductive silicon having a $1\times10^{16}$ cm$^{-3}$ doping in an epitaxy reactor. This produces the collector 5. In the selective epitaxy, a monocrystalline layer grows on a monocrystalline substrate, in this case the exposed surface of the subcollector 4. In this process the lateral surface insulators 6 prevent the nucleation of silicon atoms on the first polysilicon layer 7 and the second polysilicon layer 12. If a suitable material is available for the base terminal 12 and the collector terminal including the first polysilicon layer 7 and conductive layer 8, on which material no nucleation of silicon atoms occurs during the selective epitaxy, then the lateral surface insulators can be dispensed with. For the rest of the production process it is advantageous to provide a slight overgrowth of the edges of the first opening 24 in the selective epitaxy.

Figure 12:
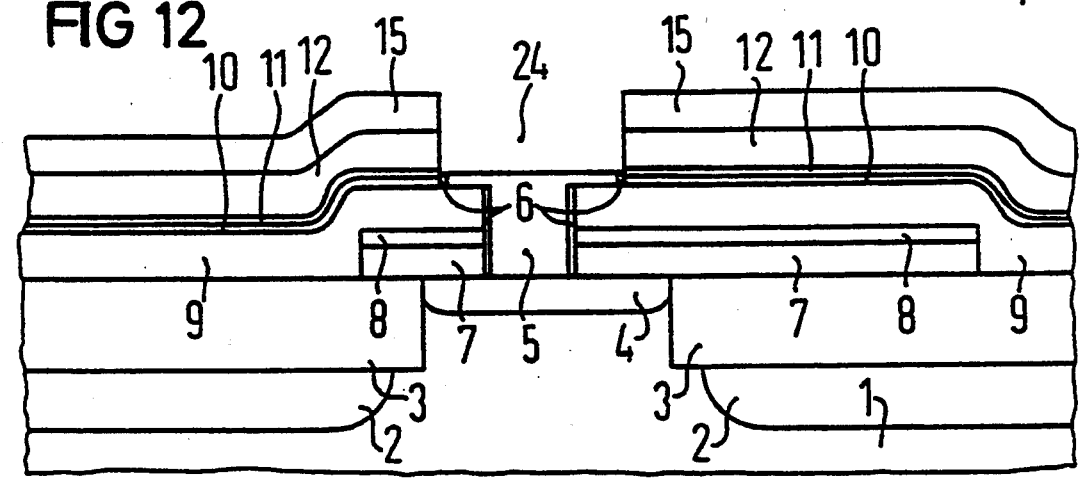

The exposed portion of the lateral surface insulators 6 is then removed at the walls of the first opening 24 by a wet-chemical etching process. As a result, the second polysilicon layer 12 is exposed in the region of the first opening 24, as seen in FIG. 12.

Figure 13:
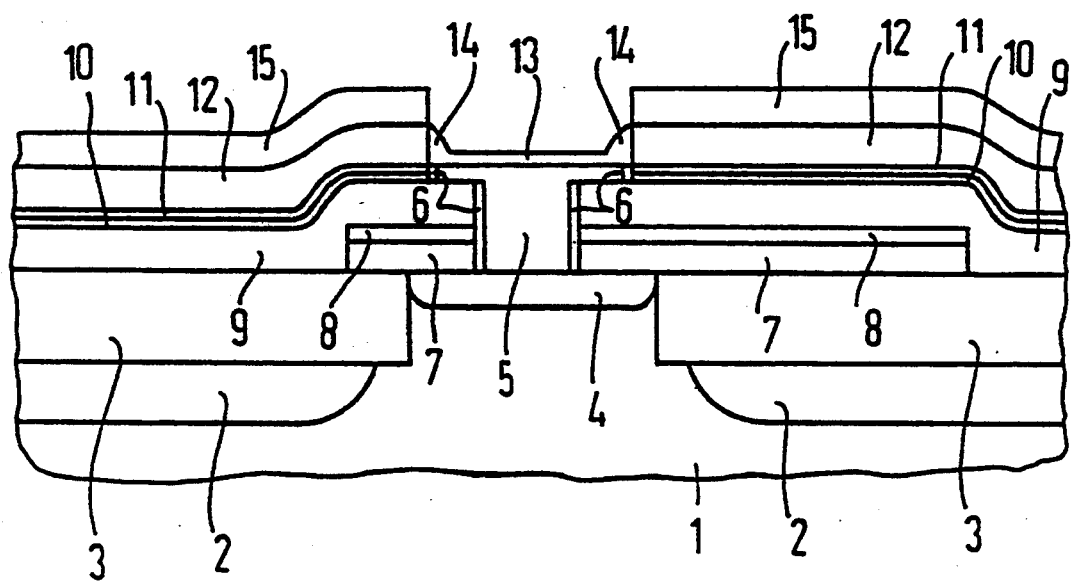

Through the use of selective epitaxy in an epitaxy reactor, the active base 13 and inactive base zones 14 are deposited into the first opening 24 on the surface of the collector 5, as seen in FIG. 13. The layer thickness of the deposited base 13 is 80 nm, for instance. The base 13 is p-doped with a doping of $1\times10^{19}$ cm$^{-3}$. Since the edges of the first opening 24 were overgrown in the selective epitaxy for producing the collector 5, the selective epitaxy for producing the active base 13 takes place on a coherent crystal surface. This has a favorable effect on the crystalline structure. In the selective epitaxy, crystallization beginning at the exposed lateral surfaces of the second polysilicon layer 12 also takes place. In this region, grain boundaries must be expected. However, this does not unfavorably affect the operation of the transistor, because the grain boundaries are located solely in the inactive base zones 14 and will later be covered with spacers 16a.

Figure 14:
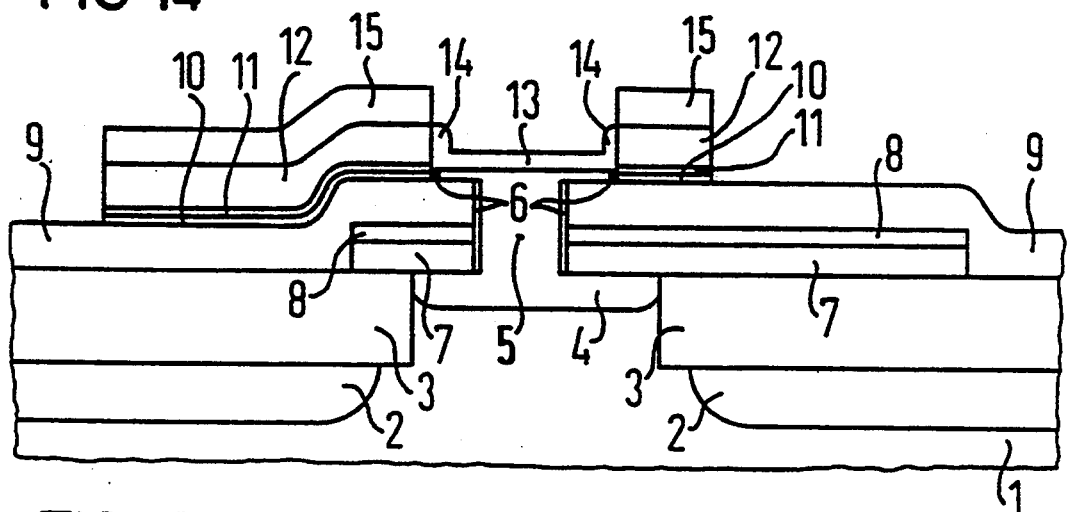
Figure 15:
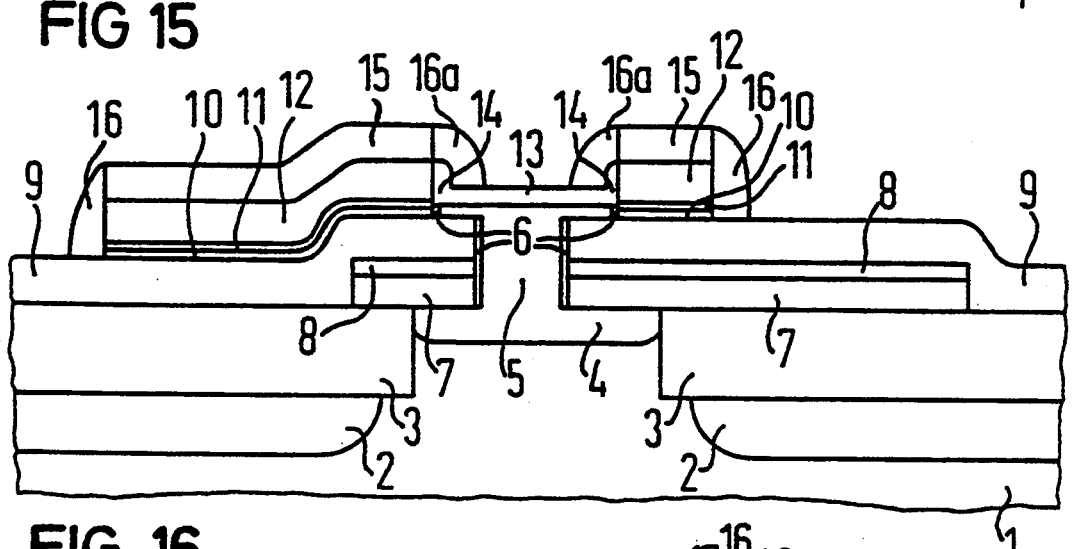

Through the use of a photo technique, the second oxide film 15, the second polysilicon layer 12, the first oxide film 11 and the first auxiliary polysilicon layer 10 are structured. The structuring is effected in such a way that on at least one side of the active transistor zone, the second polysilicon layer 12 extends far enough toward the first oxide film 9 that a contact hole etching is possible at that location, as seen in FIG. 14.

In order to produce the spacers 16, a further oxide film is deposited at a thickness of 150 nm, for instance, and is back-etched by an anisotropic dry etching step. The inner spacers 16a seen in FIG. 15 lead to a self-alignment of the emitter/base complex. They shift any grain boundaries created at the base rim into inactive zones of the transistor. Furthermore, these inner spacers 16a produced in a self-aligned manner or in other words without using a photo technique, are located entirely in the inactive transistor zone. They do not take any space away from the active transistor zone, and therefore their production does not add to the base/collector capacitance.

Figure 16:
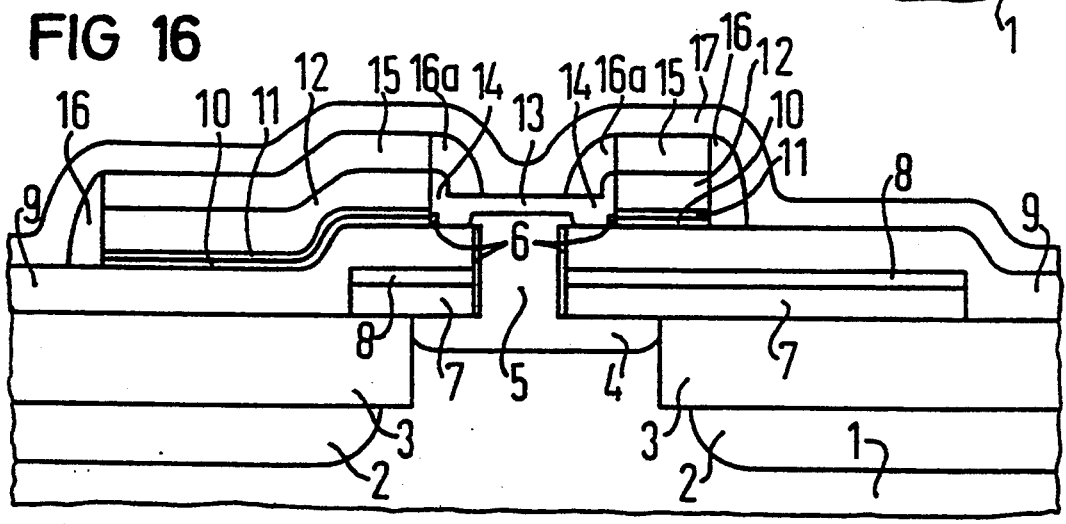

The third polysilicon layer 17 is applied to the surface over the entire surface area of the structure as seen in FIG. 16. The layer thickness of the third polysilicon layer 17 applied is 100 nm, for instance. This is followed by an implantation with n-doped ions into the third polysilicon layer 17. Next, the third polysilicon layer 17 is structured by an uncritical photo technique in such a way that it overlaps the active base 13 and the inactive base zones 14. The emitter 18 is produced by out-diffusion from the third polysilicon layer 17. The emitter layer 18 is forced into the monocrystalline silicon by a distance of 30 nm, for instance.

Through the use of a photo technique, the contact holes for the base terminal in the second oxide film 15 and for the collector terminal in the first oxide film 9 are opened. The metallization of the emitter contact 19, the base contact 20 and collector contact 21 then follows. The finished transistor structure that results in equivalent to what is shown in FIG. 1.

The production process described for an n-p-n bipolar transistor can readily be applied to a p-n-p bipolar transistor instead.

A variant of the production process is attained by producing the monocrystalline zones for the base and the collector in a selective epitaxy step, and then producing the base by ion implantation.

Since the active transistor zones are located solely in regions or zones that were produced by selective epitaxy according to the process of the invention, this process is suitable for integration into a BICMOS process. In such a BICMOS process, the production of the first polysilicon layer 7 and the conductive layer 8 takes place after the channel implantation. It is also advantageous for the gate metallization to provide these two layers. This makes it possible to dispense with a mask. In a BICMOS process, the already finished processed CMOS transistors are covered with the first oxide film 9.

Integrating the production process according to the invention into a BICMOS production process enables independent optimization of both the bipolar and the CMOS components.

We claim:

1. Bipolar transistor, comprising insulator structures defining an active transistor zone having a base, an emitter with a side facing away from said base, and a collector with a collector terminal having a side facing away from said base, said insulator structures being disposed on said sides of said emitter and said collector terminal facing away from said base, and said insulator structures limiting current flow through said active transistor zone.

2. Bipolar transistor according to claim 1, wherein said emitter and said collector have surfaces, and said insulator structures define active surfaces on said emitter surface and said collector surface being of equal size and facing one another.

3. Bipolar transistor according to claim 1, wherein said collector has a surface being equal in size to said active base.

4. Bipolar transistor of claim 1, wherein:
   a) said base has a base terminal laterally contacting and annularly surrounding said base and inactive base zones formed by out-diffusion from said base terminal;
   b) said base terminal and said inactive base zones being disposed between said insulator structures defining said active transistor zone, for completely avoiding a boundary surface between said base terminal and said collector and minimizing contact between said inactive base zone and said collector.

5. Bipolar transistor according to claim 4, wherein:
   a) said insulator structures have a side adjacent said active transistor with a structure being disposed beneath said base terminal and protruding past said base terminal by a zone being self-aligned by a spacer technique; and
   b) said inactive base zones are disposed on said zone being self-aligned by a spacer technique.

6. Bipolar transistor according to claim 4, wherein said collector terminal includes at least one layer being formed of a material selected from the group consisting of doped polysilicon and silicide.

* * * * *